United States Patent [19]

Luetzow

[11] 3,818,122

[45] June 18, 1974

[54] FLEXIBLE PRINTED CIRCUIT INTERCONNECTING CABLE

[75] Inventor: Edwin Jerome Luetzow, Northfield, Minn.

[73] Assignee: G. T. Schjeldahl Company, Northfield, Minn.

[22] Filed: May 29, 1973

[21] Appl. No.: 364,367

[52] U.S. Cl. .............. 174/86, 174/117 FF, 339/8 R

[51] Int. Cl. .............. H02g 15/08

[58] Field of Search ......... 174/68.5, 117 FF, 113 R, 174/117 F, 34, 72 R, 72 B; 339/17 E, 17 F, 8 R, 9 R, 9 E, 1 R

[56] References Cited

UNITED STATES PATENTS

| | | | |
|---|---|---|---|
| 2,991,328 | 7/1961 | Lay | 174/72 A |
| 3,296,365 | 1/1967 | Basile | 174/117 FF |
| 3,576,941 | 5/1971 | Colgalzier | 174/117 FF |

FOREIGN PATENTS OR APPLICATIONS

| | | | |
|---|---|---|---|
| 869,275 | 5/1961 | Great Britain | 174/86 |

*Primary Examiner*—Darrell L. Clay

[57] ABSTRACT

A flexible printed circuit interconnecting cable which includes a flexible circuitry assembly including an array of conductors mounted on a flexible substrate film and covered with a flexible covering film. In order to achieve flexure through a plurality of coordinates of planes, the substrate is cut or slit longitudinally between mutually adjacent pairs of conductors, and thereafter opposed end segments of the assembly are twisted relative to each other so as to achieve a plurality of independent helices which will provide a flexural plane for any desired relative motion between the opposed ends of the assembly. The slit wound portion may be covered with a sleeve of flexible material such as, for example, vinyl tubing or metallic spring material.

15 Claims, 10 Drawing Figures

FLEXIBLE PRINTED CIRCUIT INTERCONNECTING CABLE

BACKGROUND OF THE INVENTION

The present invention relates generally to an improved 15 printed circuit interconnecting cable, and more specifically to an interconnecting cable which is fabricated from conventional flexible printed circuitry. The present invention makes it possible for one to utilize conventional flexible circuitry or cable and yet achieve flexure of the assembly through a plurality of coordinates of planes.

By virtue of its geometry, flexible printed circuitry assemblies are traditionally flexible only along one plane. For example, the conventional flexible printed circuit assembly may be flexed along a line which is transverse to the small thickness dimension, while the material is virtually non-flexible along a plane taken coincidentally with the plane of the film. Accordingly, this has limited the application of printed circuitry, specifically flexible printed circuitry, to situations wherein flexural requirements preclude the application of conventional flexible circuitry assemblies. For such applications, therefore, conventional wire and cables have been utilized to achieve the interconnect between relatively movable terminals or pads. Such assemblies or sub-assemblies are tedious and accordingly costly in their preparation.

Flexible printed circuit interconnecting cables prepared in accordance with the present invention render it possible to apply conventional flexible printed circuitry or flexible printed cable to use wherein flexure will occur through any of the variety of coordinates of planes. Specifically, the flexible printed circuit interconnecting cable of the present invention makes possible the flexure of the cable along a plane which is coincidental with the plane of the film. In other words, the flexible printed circuit interconnecting cable of the present invention may be repeatedly flexed between two or more positions with the flexing occurring in the interconnecting cable along and within a plane which lies within the plane of the film. This flexural characteristic is not limited to extremely long spans or expanses of film, and may be achieved across such a cable which extends between relatively closely spaced opposed ends. Accordingly, the flexible printed circuit interconnecting cable of the present invention may be utilized in applications wherein flexure is required between relatively close mounting pads, and wherein the pads are interconnected by the interconnecting cable of the present invention.

SUMMARY OF THE INVENTION

Briefly, in accordance with the present invention, the flexible circuitry assembly includes an array of elongated generally rectangular electrical conductors, with these conductors being mounted between flexible substrate and covering layer. The circuitry assembly is conventionally flexible and capable of flexure about the central axis of the film, and generally parallel to a plane extending through the thickness of the assembly. At least one predetermined segment along the length of the conductors, and in an area between the opposed ends of the assembly is provided with the conductors being arranged generally mutually parallelly disposed relationship, one to another. The substrate and covering layer are slit along a line which extends between individual pairs of conductors, and within the predetermined segment wherein the conductors are arranged generally parallelly, one to another. The opposed end segments of the assembly are then twisted relative to each other by an arcuate distance of at least about 180° in order to permit flexure of the interconnecting cable through a plurality of coordinates of planes. This slitting and twisting operation provides a finished product with a capability of universal flexure.

Therefore, it is a primary object of the present invention to provide an improved flexible circuitry assembly which is capable of universal flexure throughout a plurality of coordinates of planes.

It is yet a further object of the present invention to provide an improved flexible printed circuit interconnecting cable which has individual segments slit so as to provide an interconnecting cable with opposed ends being twisted relative to each other by an arcuate distance of at least 180° in order to permit unlimited relative flexural capability between these two opposed ends.

It is yet a further object of the present invention to provide an improved flexible printed circuit interconnecting cable which is designed to accommodate repeated flexural cycles without achieving fatigue throughout or across the individual components of the circuitry assembly including the individual electrical conductors.

Other and further objects of the present invention will become apparent to those skilled in the art upon a study of the following specification, appended claims, and accompanying drawings.

DESCRIPTION OF THE PREFERRED EMBODIMENT

Figure 1:
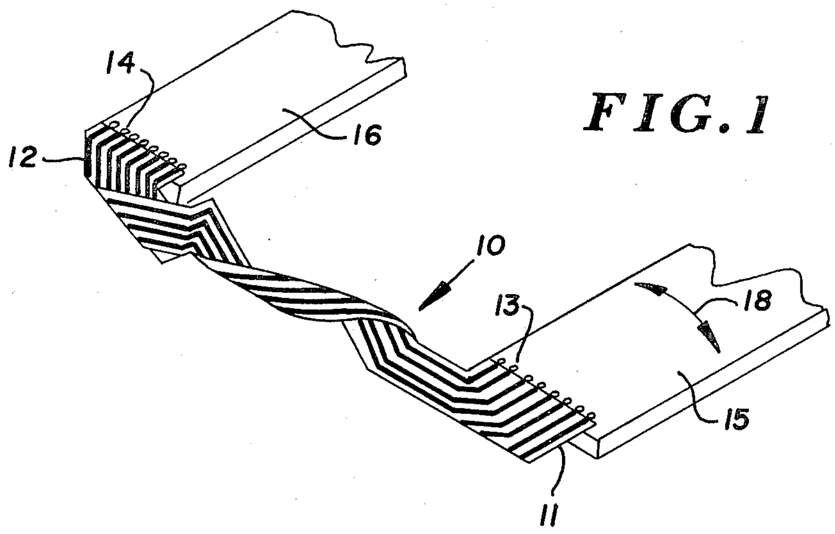
FIG. 1 is a perspective view illustrating the interconnecting cable extending between two relatively movable support members, and with the support members being capable of movement in a direction within the plane of the flexible printed circuit interconnecting cable.

In accordance with the preferred embodiment of the present invention, the interconnecting cable structure generally designated 10 is shown with its end portions 11 and 12 being secured to mating terminal areas 13 and 14 respectively which are disposed upon support members 15 and 16. Support members 15 and 16 are relatively movable, such as is illustrated by the arrow 18 on the surface of support member 15. As is apparent from the drawings, the treatment of the interconnecting cable is such that relative movement is possible between support surfaces 15 and 16 within the plane of the interconnecting members or areas 11 and 12. The flexible circuitry material is prepared from polyimide (amide) film such as is available from the E.I. DuPont deNemours Corp. of Wilmington, Del. under the Trademark "Kapton", with this film having a thickness of 1 mil. One ounce copper will be utilized for the conductors with the conductors having a covering layer of 1 mil Kapton disposed thereover. Conductor spacing is preferably in the range of approximately 25 mils. It will be appreciated, of course, that the conductor spacing or the materials being utilized are being set forth here as exemplary only.

Figure 2:
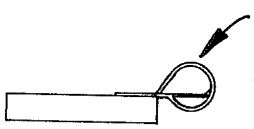
FIG. 2 is a side elevational view of the structure illustrated in FIG. 1.
Figure 3:
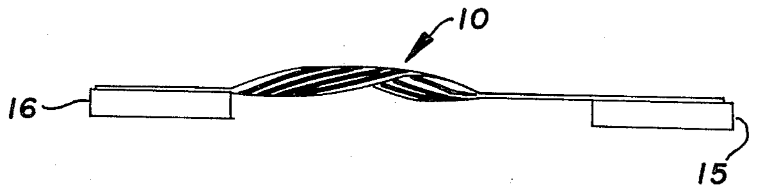
FIG. 3 is a front elevational view of the structure illustrated in FIG. 1.

In the illustration of FIG. 2, the manner in which the material is turned upon itself is apparent, with FIG. 3 supplementing this view as well.

Figures 4, 6:
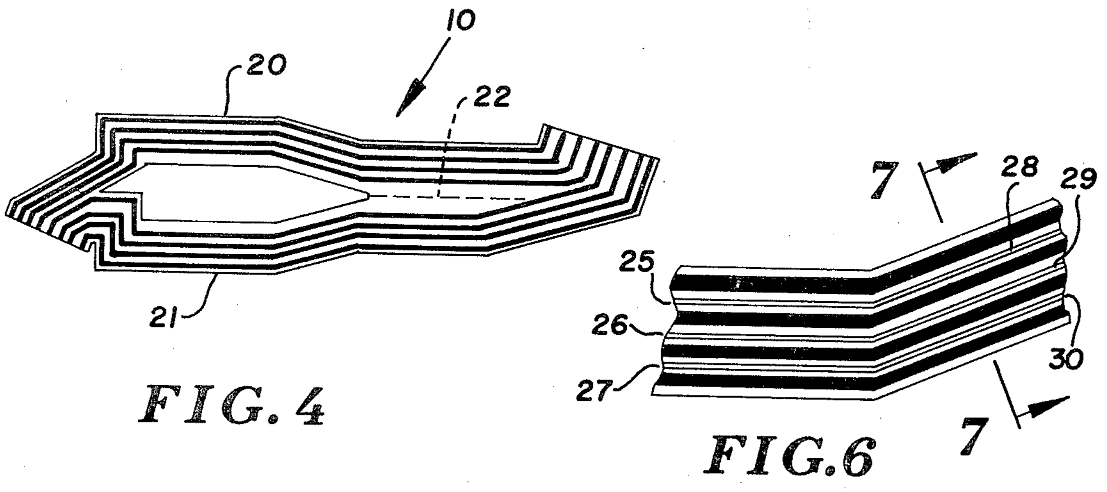
FIG. 4 is a detail top plan view of the interconnecting cable illustrated in FIG. 1, but showing the structure at an early stage of the preparation process.
FIG. 6 is a detail plan view, on a slightly enlarged scale, and illustrating a central segment portion only of the structure illustrated in FIG. 5.

The circuitry involved is conventional flexible printed circuitry and is prepared pursuant to conventional techniques. In FIG. 4, the structure is illustrated prior to its being folded upon itself, with the plane view showing the arrangement of the conductors as they appear between the individual substrate and covering layers. For example, leg portion 20 will ultimately be superimposed upon leg portion 21 substantially along the center line of the structure, such as is illustrated in the dashed dot line 22.

Figure 5:
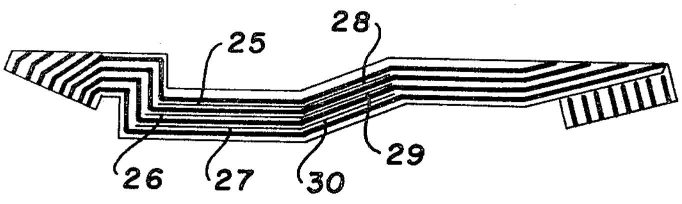
FIG. 5 is a view similar to FIG. 4, but illustrating the interconnecting cable in a later form of processing.
Figure 7:
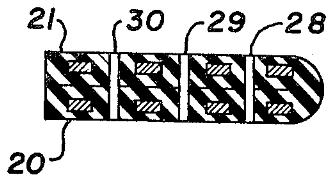
FIG. 7 is a vertical sectional view taken along the line and in the direction of the arrows 7—7 of FIG. 6, and illustrating the detail of the folded and slitted portions of the structure.

With attention now being directed to FIG. 5, the individual leg portions 20 and 21 have already been folded, one upon the other, to form the structure illustrated. The primary reason for the fold-over is to increase the length-to-width ratio, and also to add compactness to the product. It will be observed that the covering layer substrate films have been slit as at 25, 26 and 27, as well as at 28, 29, and 30. This portion of the structure is more readily apparent from a review of FIGS. 6 and 7 which are on a slightly enlarged scale so as to render the results more readily apparent.

Figure 8:
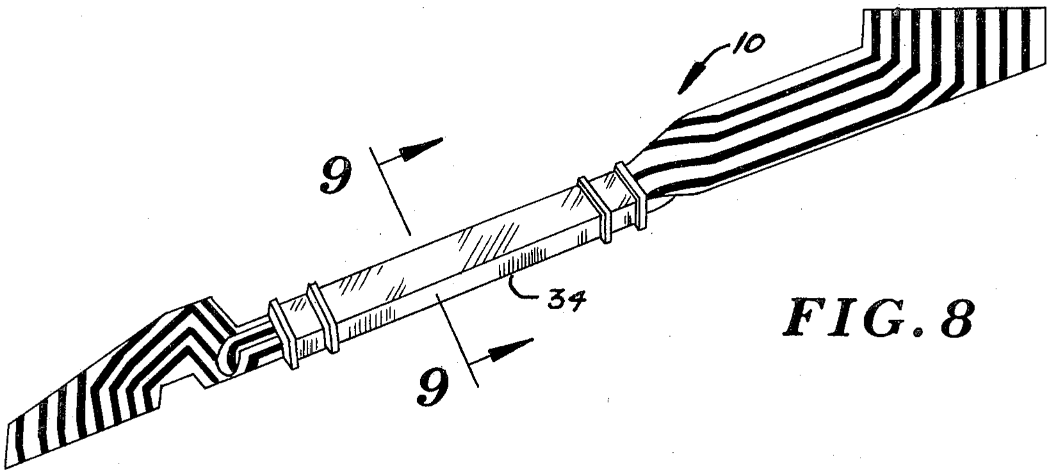
FIG. 8 is a perspective view showing the top and front surfaces of the interconnecting cable of FIG. 5, following its having the central portion thereof twisted upon itself and encapsulated within a flexible sleeve with FIG. 8 being shown on a slightly enlarged scale.
Figures 9, 10:
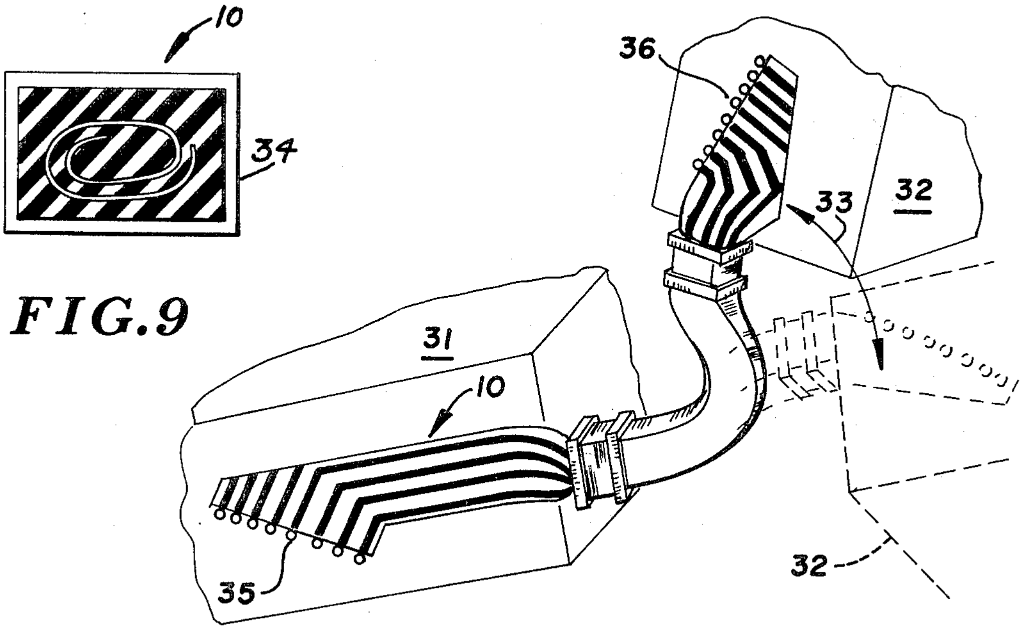
FIG. 9 is a detail vertical sectional view taken along the line and in the direction of the arrows 9—9 of FIG. 8, and illustrating the device on a still larger scale.
FIG. 10 is a detail perspective view of the interconnecting cable illustrated in FIG. 8, and showing the structure as applied to two relatively movable support members, and with portions of the support members being shown broken away.

Attention is now directed to FIGS. 8 and 9 of the drawings wherein the arrangement is illustrated in greater particularity. In this instance, a sleeve 34 of polyvinylchloride plastic has been molded about the center portion of the film, so as to provide mechanical protection for this portion of the product. In certain installations, particularly where this portion of the product will be exposed externally, it may be desirable to consider this form of sleeve or encapsulation so as to protect the product from risk of mechanical damage. FIG. 9 illustrates the cross-section of the structure, and indicates the manner in which the plastic molded part encapsulates and otherwise retains the printed circuit interconnecting cable therewithin. While polyvinylchloride plastic has been indicated as one suitable flexible material, it will be appreciated that other materials such as, for example, silicone resins, polyurethane resins including foams, polyethylene, polypropylene, and the like may be employed successfully. The primary consideration is the provision of a relatively durable sleeve for retaining the elements together and protect them from damage due to mechanical forces or the like.

In FIG. 10, for example, the structure is shown as it is applied in an actual operative assembly, wherein the support members 31 and 32 are disposed in relatively movable disposition, one to another, such as along the arrow 33. The phantom view in FIG. 10 illustrates the portion 32 as it appears in its other position. The assembly generally designated 10 is disposed upon the structure with the terminal portions 11 and 12 being coupled to mating terminal areas 35 and 36 respectively. As is apparent in the drawing, the film may be moved and rocked about its own plane without risking damage to the circuitry contained therewithin.

This type of motion permits the circuitry to be employed in a wide variety of applications, particularly those wherein the circuitry is to be mounted in flat disposition along a pair of movable surfaces, and wherein motion between the individual surfaces or supports will be along coordinates of a plane within the plane of the film.

In the preparation of the flexible printed circuit interconnecting cable, three steps are preferably utilized, with steps (2) and (3) not being required at all times, with these steps being as follows:

1. The individual conductors are cut free, one from another, in the area where they are running substantially parallel, one to another;
2. The conductors are then preferably wrapped upon each other in a helical form by twisting the individual ends for at least 180°, and preferably about 370° per 1 inch segments; and
3. The flexible printed circuit interconnecting cable treated as in step (1) and optionally step (2) is then preferably inserted within a flexible sleeve, with the sleeve covering the twisted portion to achieve uniform flexural operations, and to avoid areas of concentrated stress and resulting fatigue.

The combined steps provide an interconnecting cable which results in at least a portion of the structure being in a proper plane for the desired bending or flexural operation. The device has particular application whenever a multi-conductor interconnect is required between relatively movable base pads. When these pads are moved in the plane of the film, conventional circuitry is not normally capable of application in view of the limited folding or bending capability.

In a conventional assembly, a flexible circuitry product is utilized having the substrate and covering layer prepared from polyimide (amide) film, such as is presently available from E. I. DuPont deNemours Corp. of Wilmington, Del, under the Trademark Kapton, with this film having a thickness of 1 mil. One ounce copper will be utilized for the conductors, with the conductors having a conventional width, such as, for example, in the range of approximately 25 mils. The individual conductors are arranged in parallelly disposed relationship along at least one segment of the interconnecting cable, with this parallelly disposed relationship extending for a length of at least about 1 inch. The structure may be folded over upon itself so as to increase the length-to-width ratio, and also to decrease the number of individual cutting operations which must be otherwise conducted on the film. When folded over on itself, the individual segments are thereafter bonded to one another in order to control the product for later operations. With this flexible printed circuit interconnecting cable being available, conventional printed circuitry may be applied to a variety of products and installations where such application was not previously possible.

The individual conductors are wrapped by twisting the opposed ends of the cable by an amount equal to, preferably 370° per 1 inch segment. It will be appreciated that certain assemblies need only be twisted by approximately only 180° in order to permit universal flexure. The additional twisting for the longer segments has been found to enhance the flexural characteristics of the overall assembly.

The individual circuitry patterns may be generated by any of the conventional means, such as, for example, chemical milling, mechanical stamping, or electrodeposition. For most applications, however, chemical milling techniques are to be preferred. Copper is the conventional conductor and is also preferred. The ratio of conductor width to thickness is preferably at least about 25, although other ratios may be utilized and this is not a critical feature.

The flexible sleeve or molded protecting member which is utilized to confine or capture the twisted portion is preferably prepared from flexible tubing, such as, for example, vinyl tubing such as polyvinylchloride or the like. Such tubing provides a durable, mechanically sound and useful product. As an alternative, a solid metallic spring may be employed, however the synthetic resin tubing such as vinyl tubing silicone is preferred for most applications. The word "sleeve" is taken in a comprehensive sense and will also include structures which are molded as is illustrated in FIGS. 8 and 9 of the drawings. In one operative embodiment, a sleeve may be molded about the circuitry in a two-shot molding operation, wherein in the first operation, a slotted sleeve is actually prepared, with the circuitry thereafter being inserted and a second covering layer is then molded therearound. In this operation, there is a lesser tendency toward filling the entire area around the circuitry portion.

While the polyimide(amide) film described above is normally preferred, it will be appreciated that the concept of the present invention may be utilized with those conventionally employed substrate materials such as, for example, stress-oriented polyethylene terephthalate (Mylar), polyolefins such as polyethylene or polypropylene, polytetrafluoroethylene, and the like. In other words, the concept is adapted to the geometry without regard to the individual materials being employed in the product.

I claim

1. In a flexible circuitry assembly, including an array of elongated, generally rectangular electrical conductors, each conductor being mounted between flexible substrate and a covering layer, and extending generally between the opposed ends thereof, with each conductor having a relatively thin cross-section and being capable of flexure about the central axis thereof, at least one predetermined segment of the length of each of said elongated conductors in an area between opposed ends thereof being arranged in generally mutually parallelly disposed relationship, one to another; the arrangement being characterized in that:

a. said substrate and covering layer being slit along a line extending between each adjacent conductor within said predetermined segment; and b. said opposed ends being mounted upon relatively movable support surfaces, the arrangement being such that said predetermined segment may become twisted upon itself between mutually adjacent slit lines.

2. The flexible circuitry assembled as defined in claim 1 being particularly characterized in that said electrical conductors consist essentially of copper.

3. The flexible circuitry assembly as defined in claim 1 being particularly characterized in that the width-to-thickness ratio of said conductors is at least about 25.

4. The flexible circuitry assembly as defined in claim 1 being particularly characterized in that said substrate and covering layer are selected from the group consisting of polymide(amide), stress-oriented polyethylene terephthalate, polytetrafluoroethylene, polyethylene, and polypropylene.

5. The flexible circuitry assembly as defined in claim 1 being particularly characterized in that said predetermined segment is disposed within a flexible sleeve.

6. The flexible circuitry assembly as defined in claim 5 being particularly characterized in that said flexible sleeve is vinyl tubing.

7. The flexible circuitry assembly as defined in claim 1 being particularly characterized in that said flexible circuitry assembly is folded on itself about the longitudinal axis of the assembly with the mating surfaces being bonded one to another.

8. In a flexible circuitry assembly, including an array of elongated, generally rectangular electrical conductors, each conductor being mounted between flexible substrate and a covering layer, and extending generally between the opposed ends thereof, with each conductor having a relatively thin cross-section and being capable of flexure about the central axis thereof, at least one predetermined segment of the length of each of said elongated conductors in an area between opposed ends thereof being arranged in generally mutually parallelly disposed relationship, one to another, the arrangement being characterized in that:

a. said substrate and covering layer being slit along a line extending between each adjacent conductor within said predetermined segment; and b. said opposed ends being twisted relative to each other by an arcuate distance of at least 180° to permit flexure through a plurality of coordinates of planes.

9. The flexible circuitry assembly as defined in claim 8 being particularly characterized in that said opposed ends are twisted relative to each other by an arcuate distance of at least 370° for each inch that said films are slit between individual pairs of conductors.

10. The flexible circuitry assembly as defined in claim 8 being particularly characterized in that said electrical conductors consist essentially of copper.

11. The flexible circuitry assembly as defined in claim 8 being particularly characterized in that the width-to thickness ratio of said conductors is at least 25.

12. The flexible circuitry assembly as defined in claim 8 being particularly characterized in that said substrate and covering layer are selected from the group consisting of polyimide(amide), stress-oriented polyethylene terephthalate, polytetrafluoroethylene, polyethylene, and polypropylene.

13. The flexible circuitry assembly as defined in claim 8 being particularly characterized in that said predetermined segment is confined within a flexible sleeve.

14. The flexible circuitry assembly as defined in claim 13 being particularly characterized in that said flexible sleeve is vinyl tubing.

15. The flexible circuitry assembly as defined in claim 8 being particularly characterized in that said flexible circuitry assembly is folded on itself about the longitudinal axis of the assembly with the mating surfaces being bonded one to another.

* * * * *